United States Patent [19]

Yamazaki et al.

[11] Patent Number: 4,826,711
[45] Date of Patent: May 2, 1989

[54] SEMICONDUCTOR MANUFACTURING METHOD AND DEVICE

[75] Inventors: Shunpei Yamazaki, Tokyo; Kunio Suzuki, Atsugi; Susumu Nagayama, Tokyo, all of Japan

[73] Assignee: Semiconductor Energy Laboratory Co., Ltd., Kanagawa, Japan

[21] Appl. No.: 895,028

[22] Filed: Aug. 8, 1986

[30] Foreign Application Priority Data

Aug. 8, 1985 [JP] Japan ................ 60-175194

[51] Int. Cl.$^4$ ............................................. C23C 16/00
[52] U.S. Cl. ............................. 427/248.1; 427/255.1; 427/233; 118/719
[58] Field of Search ............... 427/86, 233, 255.1, 427/248.1; 118/719

[56] References Cited

U.S. PATENT DOCUMENTS

| 4,217,374 | 8/1980 | Ovshinsky | 427/86 |
| 4,379,181 | 4/1983 | Cannella | 427/39 |
| 4,441,973 | 4/1984 | Noguchi | 427/86 |
| 4,505,950 | 3/1985 | Yamazaki | 437/233 |
| 4,517,223 | 5/1985 | Ovshinsky | 427/86 |
| 4,637,895 | 1/1987 | Ovshinsky | 427/39 |

OTHER PUBLICATIONS

Journal of Non-Crystalline Solids 68(1984) 167–174, North-Holland, Amsterdam, "Isomerization Model for Photo-Induced Effects in a-Si:H"; Shumpei Yamazaki et al.

Primary Examiner—Shrive Beck
Assistant Examiner—Vi Duong Dang
Attorney, Agent, or Firm—Gerald J. Ferguson, Jr.

[57] ABSTRACT

An improved semiconductor processing is disclosed. In the manufacturing process, fluorine gas is introduced just after formation of semiconductor layer in a reaction. The semiconductor thus formed demonstrates SEL effect in place of Staebler-Wronski effect.

19 Claims, 4 Drawing Sheets

SEMICONDUCTOR MANUFACTURING METHOD AND DEVICE

BACKGROUND OF THE INVENTION

1. Field of the Invention

The invention relates to an improved semiconductor manufacturing device in which SEL(State Excited by Light) effect can be enjoyed.

2. Prior Art

There have been known processing techniques for semiconductor device comprising a substrate and non-monocrystalline semiconductor layer formed on the substrate. In many products according to such techniques, some undesirable effects are observed. Namely, immediately after fabrication, a highly purified semiconductor exhibits decrease of conductivity under photo annealing in atmospheric air whereas it recovers by virtue of thermal annealing. The effect appears repeatedly. The inventors have found that such phenomenon, called Staebler-Wronski effect, is observed only on semiconductors taken out from a vacuum chamber and placed in contact with atmosphere.

Not only repetition of increase and decrease in conductivity, the conductivity tends to gradually decrease as repeating Staebler-Wronski effect. This is undesirable especially in semiconductors applied to solar cells.

SUMMARY OF THE INVENTION

An object of the invention is to produce improved semiconductors which are thermally and optically stable.

Another object of the invention is to produce improved semiconductors on which is unlikely generation of dangling bonds.

Further an object of the invention is to provide an improved semiconductor layer which does not degrade even under repetition of Staebler-Wronski effect.

DETAILED DESCRIPTION OF THE PREFERRED EMBODIMENTS

Figure 1:
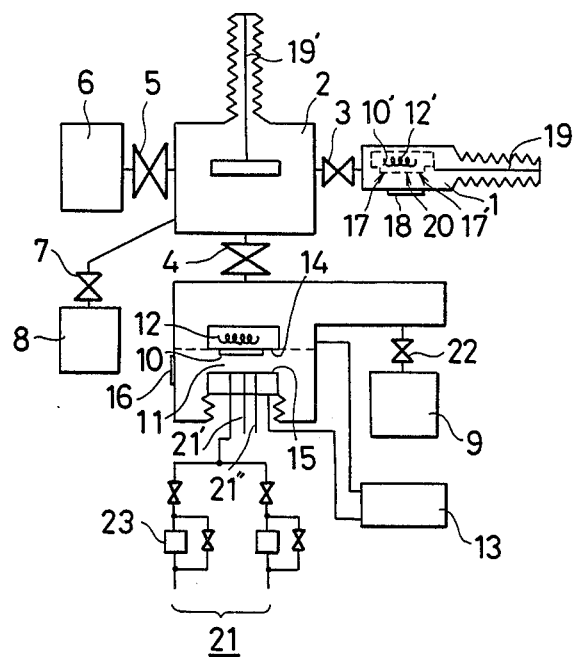
FIG. 1 is a schematic view of a plasma vapour reactor as an embodiment of the invention.
Figure 2:
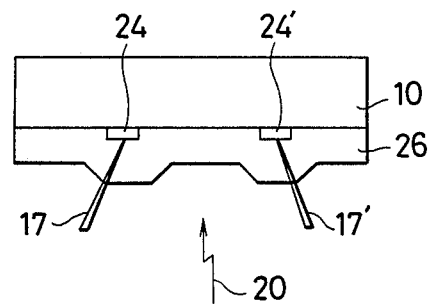
FIG. 2 is a cross sectional view showing a method for measuring the electric conductivity of a semiconductor according to the embodiment of the invention.

Referring to FIG. 1, an embodiment equipped with an ultra high vacuum apparatus according to the invention is shown. In the figure, a substrate 10' made of artificial quartz is placed below a heater 12' in a first pre-stage chamber 1. The substrate 10 is provided with a pair of electrodes (designated at 24 and 24' in FIG. 2) for measuring electric conductivity. To these electrodes contact can be made with a pair of probes 17 and 17' from outside after formation of a semiconductor layer for making it possible to measure in situ the conductivity of the semiconductor in the presence of light and the conductivity in the absence of light, without making contact with atmospheric air.

The substrate 10' can be transported together with the heater 12' between the first and second chambers 1 and 2 through the gate valve 3. The second pre-stage chamber 2 is provided with a cryosorption pump 6 through a second gate valve 5 and a turbo molecular pump 8 through a third gate valve 7. After placing the heater 12' on which the substrate 10' is held in the first chamber 1, the turbo molecule pump 8 is driven to evacuate the interiors of the first and second chambers 1 and 2 with the gate valves 3 and 7 opened and the gate valves 5 and 4 closed. When a pressure of $10^{-6}$ torr or less has been attained in the chambers 1 and 2, the heater 12' with the substrate 10' are transported from the first chamber 1 to the second chamber 2 by means of a first transportation mechanism 19. Then the interior of the second chamber 2 is further evacuated to the order of $10^{-10}$ torr with the gate valves 3 and 7 closed and the gate valve 5 opened by means of the cryosorption pump 6.

Upon making the interior of a reaction chamber 11 evacuated to a negative pressure of $10^{-9}$ to $10^{-10}$ torr by a second cryosorption pump 9 connected to the reaction chamber 11 through a gate valve 22, the substrate 10 on the heater 12 is transported from the second pre-stage chamber 2 to the reaction chamber 11 by means of a second transportation mechanism 19' through an open gate valve 4. Then the valve 4 is closed and between a pair of electrodes 14 and 15 are taken place plasma discharge supplied with power from a high frequency voltage supply 13 takes place to carry out a plasma CVD method on the substrate 10. Concurrent with the plasma discharge, light irradiation may be carried out by irradiating the interior of the reaction chamber 11 with an eximer laser or the like through a window 12.

In the figure, although two sets of substrates 10 and 10' and heater 12 and 12' appear, this is made only to expedite explanation and understanding of the embodiment and practically there is one set alone of course.

The reactive gas for the plasma CVD method is introduced from a doping system 21 to the interior of the reactive chamber 11. The pressure of the reaction chamber is kept suitable for carrying out the CVD method optimally by the turbo molecular pump 9.

The pressure in the reaction chamber 11 is kept at 0.001 to 0.1 torr, normally at 0.05 to 0.1 torr. By virtue of high frequency energy, e.g., of 13.56 MHz and 10 watt, applied from the power supply 13, a nonmonocrystalline semiconductor film, an amorphous silicon doped with hydrogen in this embodiment, is formed according to the plasma CVD processing. For example, a nonmonocrystalline semiconductor layer of thickness 0.6 microns which is doped or not doped with p-type or n-type impurities is formed on the substrate 10 at 250° C. (or less than 500° C.).

The reactive gas and a carrier gas should be purified to the level in which the inclusive rates of oxygen and water are reduced to less than 0.1 ppm, more preferably to less than 1 ppb before introduction to the reactive chamber 11 in order to reduce the minimum oxygen density in the semiconductor less than $5 \times 10^{18}$ cm$^{-3}$, more preferably less than $1 \times 10^{18}$ cm$^{-3}$. As such a reactive gas, silane can be employed which is highly purified by a liquefaction purification for fabrication of silicon film.

In case where a photoelectric cell is to be formed, high doping is suitable. To make a p-type semiconductor, the silane gas is doped with diborane at 500 to 5000 ppm. To make a n-type semiconductor the silane gas is doped with phosphin at about 5000 ppm. The impurities are introduced from a inlet port 21″.

Upon completion of the forming of the semiconductor layer 26, the supply of the reactive gas is interrupted and the residue in the reaction chamber 11 is eliminated. Then, fluoride gas of purity 19% or higher is introduced as a neutralizer agent into the reaction chamber from the doping system.

Namely, fluorine (m.p.$-223°$ C., v.p.$-187°$ C.) retained in a vessel is liquefied by liquefied nitrogen. Then, the liquefied fluorine is vaporized under negative pressure and purified as a very highly purified fluorine. In virtue of this processing, the fluorine is estimated to have higher than 99.99% purity with very few oxygen having a dew point lower than $-60°$ C.

The inner wall of the reaction chamber 11 is coated with semiconductor layers which have been concurrently with the fabrication process of semiconductor layer on the substrate 10. The semiconductor layer on the wall can function to prevent the chamber from corrosion by fluorine gas.

Fluorine thus introduced is attached on the surface and enters into gaps of the semiconductor layer where fluorine atoms substitute for hydrogen atoms binding with silicon to create Si—F bindings in places of Si—H bindings. Also the fluorine atoms on the layer expel hydrogen atoms away from the semiconductor layer and bind with silicon atoms instead, because the electric negativity of fluorine is 4.0 larger than 3.5 of oxygen.

In this process, radiation from a window 16 is effective so that fluorine gas is sufficiently excited. Furthermore thermal annealing may be carried out on the fluorine gas introduced so that fluorine atoms can permeate into the semiconductor layer and substitute a large number of fluorine atoms binding with silicon atoms.

After evacuating the reaction chamber 11 by the turbo molecular pump 9, the substrate 10 on the heater 12 is transported from the reaction chamber 11 to the first pre-stage chamber 1 through the second pre-stage chamber 2 with the gate valves 3 and 4 opened. Then, with the gate valve 4 closed and the gate valve 5 opened, the pressure in the first pre-stage chamber 1 is kept at a prescribed negative pressure by the cryosorption pump 6. The negative pressure may be less than $10^{-3}$ torr, preferably $10^{-6}$ to $10^{-9}$ torr.

For the semiconductor layer 10, light irradiation annealing and thermal annealing are repeated for examining the change of the conductivity of the semiconductor layer 10. The thermal annealing is carried out with halogen light (100 mW/cm$^2$) and the photo annealing is carried out supplying power from the heater. The measuring of the conductivity is accomplished by means of the pair of groves 17 and 17′ respectively in contact with the pair of electrodes 24 and 24′ in situ, namely at a negative pressure.

In advance of describing the experimental result of measuring the conductivity of a semiconductor formed by the device according to the invention, a brief explanation of prior art will be made for reference.

Figure 3:
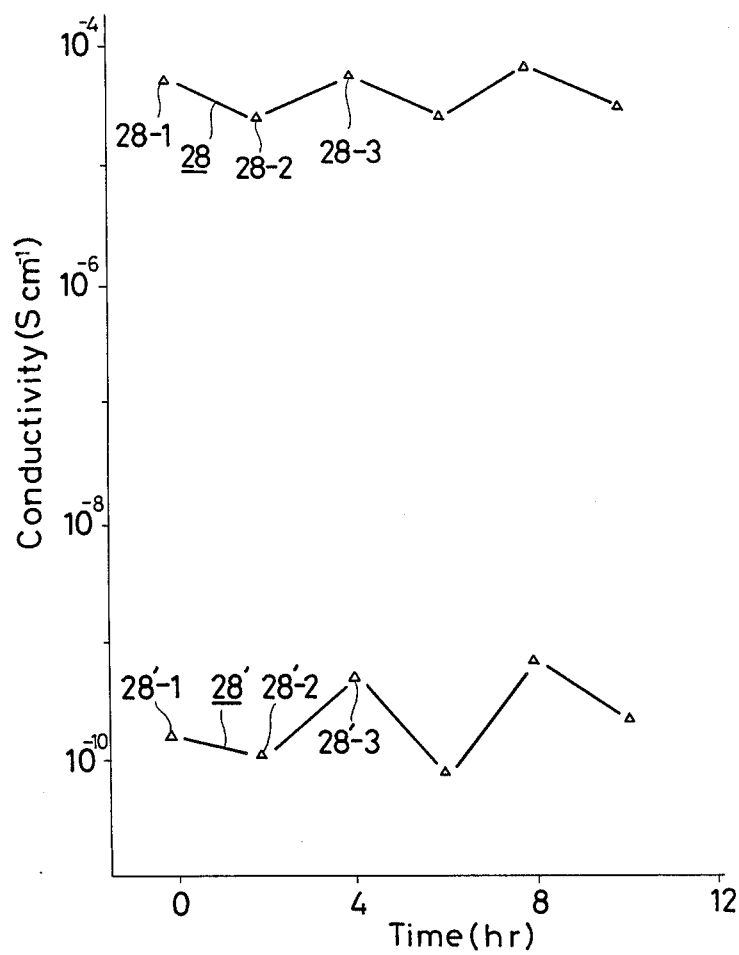
FIG. 3 is a graphic diagram showing the electric conductivity characteristic of a prior art intrinsic semiconductor.

FIG. 3 shows the trend of the conductivity of a conventional semiconductor undergoing thermal annealing and photo annealing in turn in atmospheric circumstances. As the conventional semiconductor a silicon semiconductor layer of 0.6 microns thickness formed on a quartz glass pane was measured.

In the following, the conductivity in presence of light (from a xenon lamp) is referred to as a photo conductivity and the conductivity in absence of light is referred to as a dark conductivity.

In the figure, the initial photo conductivity is designated as 28-1, and the initial dark conductivity as 28′-1. Light of AM1(100 mW/cm$^2$) is radiated from a xenon lamp to the semiconductor layer and as a result photo and dark conductivities 28-2 and 28′-2 were measured showing decreases from the initial levels. Then, thermal annealing is carried out, for this layer, at 150° C. for 2 hours, and thereafter conductivity is measured, the result being seen in the figure with 28-3 and 28′-3 showing increases from the preceding levels. In this manner, thermal and photo annealings are repeated one after another. As a result, Staebler-Wronski effect is demonstrated as shown in FIG. 3, in which both the photo and dark conductivities are decreased by photo annealing and recovers by virtue of thermal annealing repeatedly.

Figure 4:
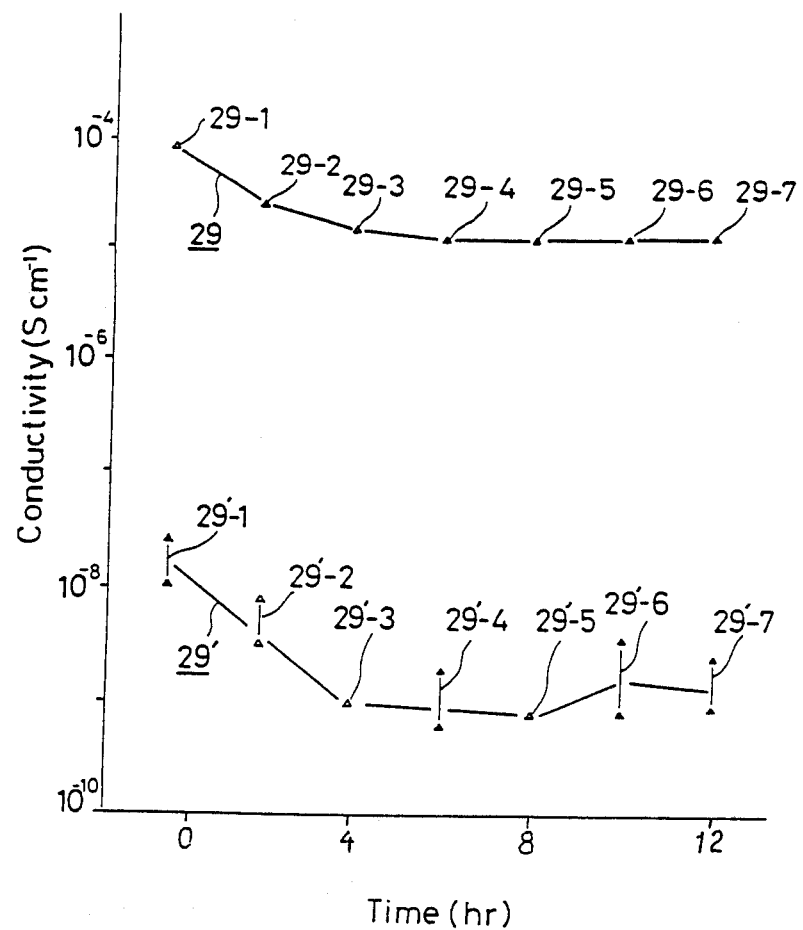
FIGS. 4 and 5 are graphic diagrams showing electric conductivity characteristics of semiconductors formed by a semiconductor manufacturing device according to the invention.
Figure 5:
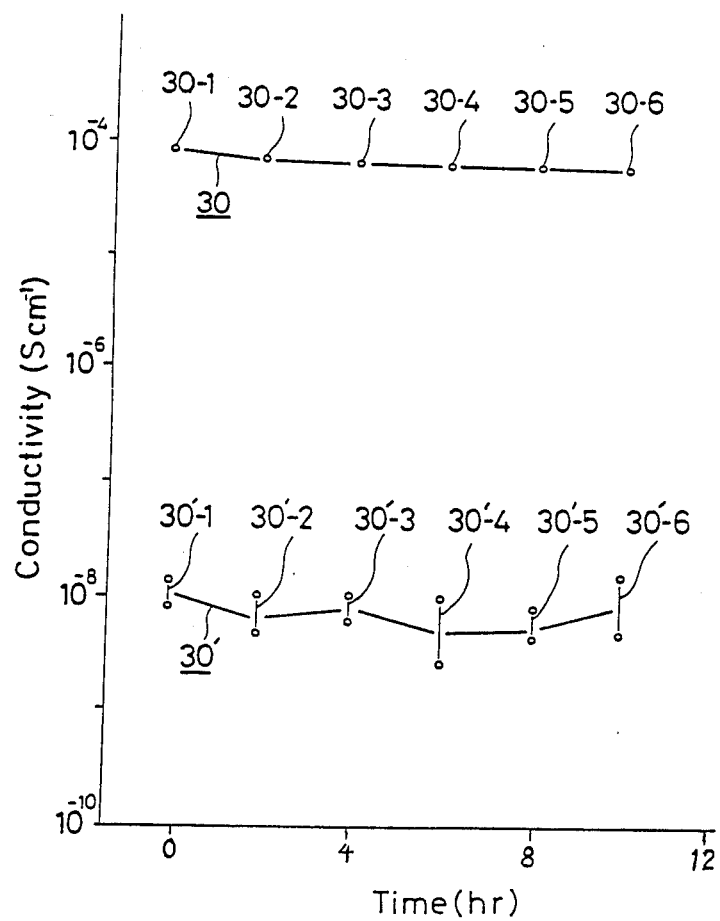

Referring now to FIGS. 4 and 5, the transition of the conductivity of the semiconductor manufactured by the device of the invention is shown in response to optical and thermal annealings carried out one after another as in the above. On the curves, measurement results are designated by 29-1, 29-2, ... (29′-1, 29′-2, ...) indicating the ordinal number of measurement and the apostrophe indicating the absence of light as like in FIG. 3.

FIG. 4 is a graphic diagram showing the conductivity of a semiconductor formed by the device of the invention without treatment with fluorine. As described above, the measurings were made in the pre-stage chamber 1 under negative pressure without making contact with air.

On initial measuring, a dark conductivity 29′-1, $1.5\times10^{-8}$ Scm$^{-1}$ and a photo conductivity 29′-1, $9\times10^{-5}$ Scm$^{-1}$ are obtained at 25° C., and $4\times10^{-8}$ torr. Thereafter the semiconductor underwent photo annealing for two hours at 100 mW/cm$^2$ by a xenon lamp. A dark conductivity 29′-2, $6\times10^{-9}$ Scm$^{-1}$, and a photo conductivity 29-2, $3.5\times10^{-5}$ Scm$^{-1}$ are obtained indicating decreases from the initial levels like the prior art. Next, the semiconductor underwent thermal annealing for 3 hours at 150° C. Unexpectedly, as a result, the conductivity further decreased unlike conventional measuring. This phenomenon discovered by the inventors has been named SEL effect. Meanwhile, although "SEL" corresponds to the abbreviation of the assignee's name, this SEL was derived rather from "State Excited by Light". The reason why the SEL effect is taken place instead of Staebler-Wronski effect is supposed because dangling bonds of the semiconductor remained as they are during repetition in the evacuated chamber.

FIG. 5 shows a conductivity of the semiconductor measured in situ in the device on the invention in which fluorine was introduced into the reaction chamber after formation of semiconductor layer.

The fluorine gas thus introduced makes contact with the surface and gaps of the semiconductor layer and substitutes for hydrogen binding with the silicon constituting the semiconductor layer according to the equation

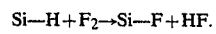

Once the fluorine substitutes, it is unlikely to give its place to oxide in virtue of the electric negativity. The measurement of this embodiment only showed a similar trend to the previous example in FIG. 4 under the repetition of thermal and photo annealings.

In the figure, 30-1 and 30'-1 designate the initial photo conductivity, $9.5 \times 10^{-5}$ Scm$^{-1}$ and dark conductivity, $1 \times 10^{-8}$ Scm$^{-1}$ respectively. 30-2 and 30'-2 designate the photo and thermal conductivities respectively after the introduction. As shown from the figure, no substantial change was observed.

Though the above invention has been described with respect to specific preferred embodiments thereof, many variations and modifications can be applied as below.

To the fluorine gas an inert gas may be doped with which is chosen a gas or blend out of argon, krypton, xenon and helium which are purified to 99.99%.

After formation of the semiconductor layer, the semiconductor layer may be transported to another chamber in atmosphere of a high purified inert gas, followed by replacing the inert gas with fluorine gas. In this case, decrease of conductivity under the repetition of the above annealing is somewhat applicable.

The semiconductor can be thermally processed at 100° to 500° C., more desirably 250° to 300° C., at ambient pressure in the atmosphere of fluorine mixture made active by ultraviolet light radiation. For this semiconductor thus processed, almost same characteristic as shown in FIG. 5 was observed.

The present invention is also applicable to semiconductor layers which are fabricated by photo CVD method.

Besides amorphous silicon, $SixC_{1-x}$ ($0 < X < 1$), $SixSn_{1-x}$ ($0 < X < 1$), $SixGe_{1-x}$ ($0 < X < 1$), in which hydrogen and/or fluorine is doped, or amorphous silicon fluoride or other nonmonocrystalline semiconductor can be applied to the invention.

As neutralizer agent, fluoride such as HF, $CHF_3$, $CH_2F_2$, $CF_4$, $GeF_4$, $Si_2F_6$ or so on, and chloride such as HCl, $CHCl_3$, $CH_2Cl_2$, $CCl_2F_2$, or so on can be employed with irradiation of ultraviolet light. Also oxide can be used in cooperation with ultraviolet light which decomposes the oxide into atoms.

As easily understood, additives utilized in the invention as neutralizers are entirely different from that of prior art, for example, described in U.S. Pat. No. 4,226,898 in which these additives are introduced simultaneously with fabricating process of a semiconductor carrying out in the ambience of reactive gas including impurities.

What is claimed is:

1. A semiconductor device manufacturing method comprising:
   a step of forming a non-single crystalline semiconductor layer on a substrate by CVD in a reaction chamber;
   then a step of evacuating said reaction chamber with said semiconductor layer substrate remaining therein; and
   then a step of terminating the dangling bonds on the external surface of said semiconductor layer with fluorine by exposure of the surface of said semiconductor layer to the ambience of very highly purified fluorine gas after completion of said forming step.

2. A method of claim 1 wherein said fluorine gas is introduced up to the atmospheric pressure.

3. A method of claim 2 wherein said said fluoride is doped with an inert gas.

4. A method of claim 1 wherein said termination step is carried out lower than 500° C.

5. A method of manufacturing a semiconductor device comprising:
   putting a substrate to be coated with semiconductor film in a reaction chamber for CVD;
   inputting a reactive gas into said reaction chamber;
   forming a semiconductor film on said substrate by CVD;
   evacuating said reaction chamber to eliminate exhaustion gas lingering therein; and
   introducing a fluoride gas into said reaction chamber with said substrate remaining therein.

6. A method of claim 5 wherein said ambience of fluorine is a pure concentrated fluoride gas.

7. A method of claim 6 wherein the purity of said fluorine gas is 99.99% or higher.

8. A method of claim 7 wherein said reactive gas is inputted together with hydrogen gas.

9. A semiconductor device manufacturing method comprising:
   a step of forming a non-single crystalline semiconductor layer on a substrate by CVD in a reaction chamber;
   then a step of evacuating said reaction chamber with said semiconductor layer substrate remaining therein; and
   and then a step of exposing the external surface of said semiconductor layer with very highly purified fluorine gas after completion of said forming step.

10. A method of either of claims 1 or 9 wherein said semiconductor layer contains hydrogen.

11. A method of claim 10 wherein said semiconductor layer is hydrogenated amorphous silicon semiconductor.

12. A method of claim 11 wherein said semiconductor layer is formed by chemical vapor deposition in a reaction chamber.

13. A method of claim 12 wherein said terminating step is carried out successively after the deposition of said semiconductor layer in said reaction chamber without introducing air.

14. A method of claim 13 wherein said chemical vapor deposition is carried out by the step of evacuating said reaction chamber to a pressure less than $10^{-9}$ torr, inputting process gas to said reaction chamber and energizing said process gas to initiate the reaction.

15. A method of either of claims 1 or 9 wherein said fluorine is activated by exposure to a laser beam.

16. A method of claim 15 wherein said laser beam is generated from eximer laser.

17. A method of either of claims 1 or 9 wherein said fluorine ambience is formed with fluorine disassociated from a fluoride by irradiation of ultraviolet light.

18. A method of any one of claims 1 or 9 wherein the purity of said fluorine gas is 99.99% or higher.

19. A method of claim 9 wherein said termination step is carried out lower than 500° C.

* * * * *